United States Patent [19]

Chalfin

[11] Patent Number: 4,691,262
[45] Date of Patent: Sep. 1, 1987

[54] CIRCUIT FOR PROTECTING A POWER TRANSISTOR AGAINST A SHORT-CIRCUITED LOAD

[75] Inventor: Edward Chalfin, Shrewsbury, Mass.

[73] Assignee: Sprague Electric Company, North Adams, Mass.

[21] Appl. No.: 719,618

[22] Filed: Apr. 3, 1985

[51] Int. Cl.$^4$ .............................................. H02H 9/02
[52] U.S. Cl. ........................................ 361/56; 361/91; 323/315
[58] Field of Search ...................... 361/42, 56, 57, 88, 361/91, 93, 98, 101, 94, 18; 323/278, 315; 330/207 P

[56] References Cited

U.S. PATENT DOCUMENTS

| | | | |
|---|---|---|---|
| 3,473,106 | 10/1969 | Grabl | 361/91 X |
| 4,322,770 | 3/1982 | Sendelweck | 361/91 |
| 4,338,646 | 7/1982 | Davis et al. | 361/18 |

FOREIGN PATENT DOCUMENTS 3402341 8/1984 Fed. Rep. of Germany .
0736071 5/1980 U.S.S.R. .............................. 323/315

Primary Examiner—A. D. Pellinen
Assistant Examiner—Todd E. DeBoer

[57] ABSTRACT

An integrated circuit includes an NPN power transistor and a short-circuit-protection circuit which includes a voltage divider connected directly across the base and emitter of the power transistor. The voltage divider is a series circuit branch having two resistors and a diode connected in the polarity to turn on when the power transistor is on. A smaller NPN transistor has a base-emitter junction connected across a portion of the voltage divider, which portion includes only one of the resistors and the diode. The collector is connected to sink a bias current away from the power transistor when abnormally high currents flow in the power transistor to limit that current to a safe value.

2 Claims, 5 Drawing Figures

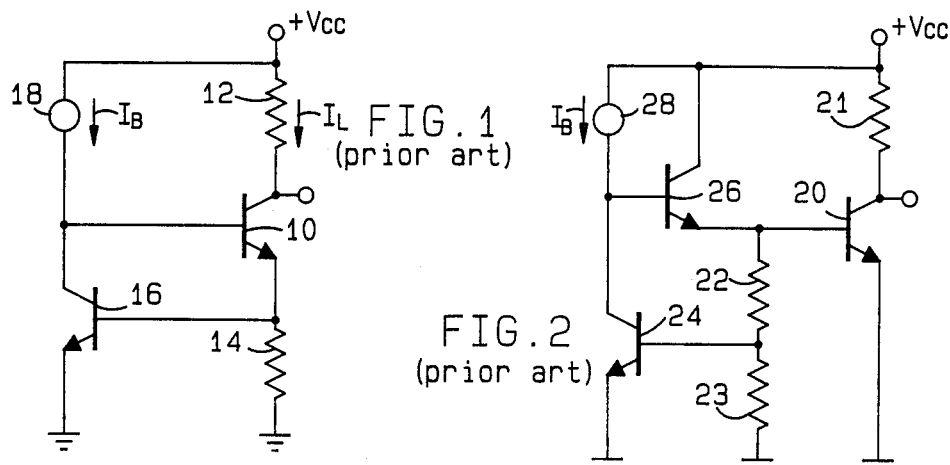
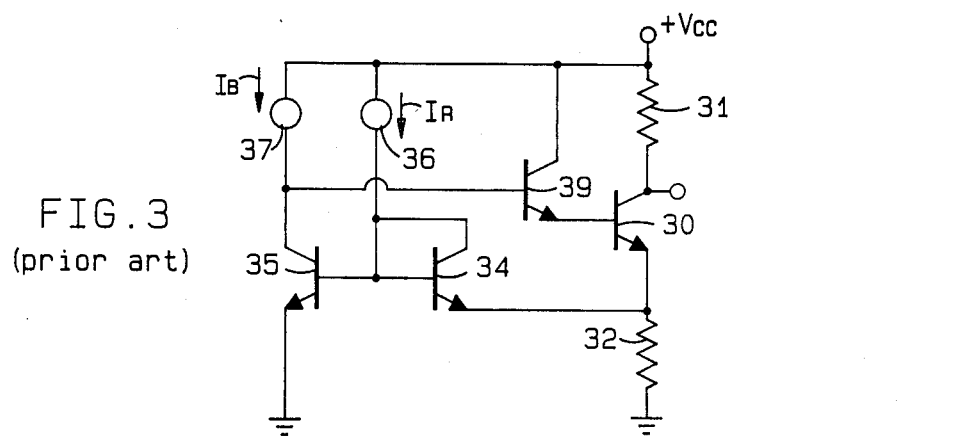
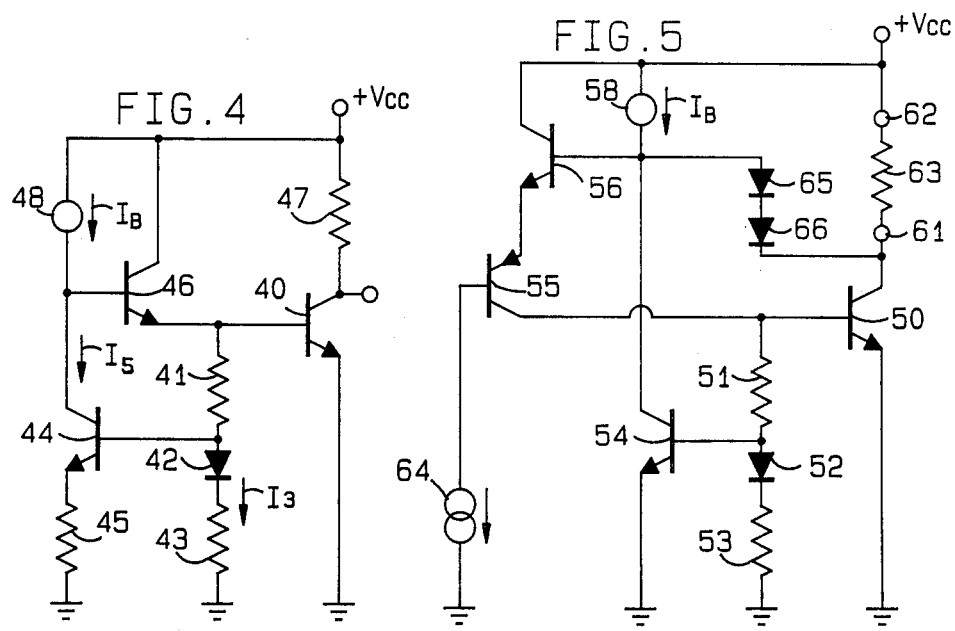

CIRCUIT FOR PROTECTING A POWER TRANSISTOR AGAINST A SHORT-CIRCUITED LOAD

BACKGROUND OF THE INVENTION

This invention relates to a circuit for protecting a power transistor against a short-circuited load and, more particularly, pertains to such a circuit that limits the load current to a predetermined safe value which either has a small negative temperature coefficient or is substantially constant with temperature.

Short circuit protection circuits that have been used in the past are illustrated in FIGS. 1, 2 and 3. In the circuit of FIG. 1, a power transistor 10 has a collector load represented by resistor 12. An emitter resistor 14 is added for sensing the emitter current which is about equal to the load current $I_L$. When the load is inadvertently shorted, the load current $I_L$ increases dramatically and would tend to overheat and quickly destroy the power transistor 10. A power transistor, as the term is used herein, is one whose base-emitter area is at least one order of magnitude greater than that of the short-circuit protecting diodes and transistors.

The protective circuit consists of emitter resistor 14 and transistor 16. It is capable of limiting the short circuit current in the load 12 to a safe value $I_{LL}$, which is henceforth referred to herein as the design-limit load current.

This is accomplished by choosing a value $R_E$ for emitter resistor 14 such that when the maximum safe load current $I_{LL}$ is reached, transistor 16 turns on and bypasses some of the bias current $I_B$ from current source 18 away from the base of the power transistor 10. The design-limit load current, $I_{LL}$, established by this circuit varies quite strongly as a function of temperature.

The on-biasing base voltage $V_{B16}$ of transistor 16 is the voltage dropped across emitter resistor 14 by the large "short circuit" current $I_{LL}$. Transistor 16, in turn reduces the bias current to the power transistor 10 by the amount that establishes the design-limit load current, $I_{LL}$. However, in this circuit the design-limit load current varies with termperature because the amount of base voltage at transistor 16 required for providing a given collector current varies at about −2 millivolts/°C. Thus, for example, a 100° C. rise in temperature will typically cause $I_{LL}$ to drop 30%. The voltage drop across resistor 14 typically reduces the output swing by 0.7 volts.

In the prior art circuit of FIG. 2, the power transistor 20 has no emitter resistor. Instead, the voltage drop between the base and emitter of power transistor 20 is impressed across the voltage divider, made up of resistors 22 and 23, which applies a fixed portion of that base-to-emitter voltage to the base of transistor 24. Another transistor 26 is connected in standard Darlington fashion to the power transistor 20 and a bias source 28 supplies bias current $I_B$ to that Darlington pair, 26 and 20.

Whenever the load current $I_L$ exceeds a predetermined value, $I_{LL}$, transistor 24 conducts, stealing as in the circuit of FIG. 1 some of the bias current $I_B$ and essentially clamping the load current at $I_{LL}$. This circuit has the advantage, that since no power emitter resistor was employed, the voltage swing across the load 21 is essentially limited only by the DC power supply voltage, $V_{CC}$. Also, more gain is provided in the feedback loop and the protective-circuit clamping of the load current is sharper avoiding distortions of moderate to large output signals across the load 21.

However, this circuit, like that of FIG. 1, has a large temperature coefficient. The voltage across the power transistor emitter resistance, at the very large load current $I_{LL}$, varies about linearly with $I_{LL}$. So the relationship between the voltage dropped across emitter resistor 14 in the circuit of FIG. 1 and the collector current of transistor 16 is essentially the same as the relationship in the circuit of FIG. 2 between the voltage dropped across the emitter resistance of power transistor 20 and the collector current of transistor 24. The voltage required between base and emitter of power transistor 20 to activate the short circuit protection can change 200 millivolts for a change in temperature of 100° C. That change corresponds to about a 30% change in the design limit load current, $I_{LL}$, established by the protection circuit.

In a third prior-art short-circuit protection circuit, a power transistor 30 has a collector load resistor 31 of value $R_L$ and an emitter resistor 32 of value $R_E$. A pair of transistors 34 and 35 are connected to form a current mirror circuit with resistor 32 serving also as an emitter resistor in the reference current branch. The reference current, $I_R$, is generated by current source 36. A bias current $I_B$ generated by bias-current source 37 supplies bias to the power transistor 30 via Darlington connected transistor 39.

When a short circuit load current reaches a predetermined large value $I_{LL}$, the collector current of transistor 35 about equals the bias current $I_B$. The bias current to the Darlington pair of transistors 39 and 30 is reduced to a very low value and the load current is limited to $I_{LL}$. For that condition, the voltage, $V_E$, across the emitter resistor 32 is about $$V_E = V_T \ln \frac{I_B}{I_R}$$

This circuit also provides a design-limit load current, $I_{LL}$, having a rather large temperature coefficient because $V_T = KT/q$ and changes about 33% over the temperature range of from 300° K. to 400° K. It has the further disadvantage that an emitter resistor 32 must be used and, like for the circuit of FIG. 1, the output voltage across the load resistor 31 is limited. The output swing is thereby reduced to about 0.7 volts in both circuits. The circuit of FIG. 3 also has a greater tendency to oscillate owing to its large number of poles, e.g. greater than for the circuit of FIG. 2. It is also more complex and requires more integrated-circuit real estate when implemented in that form.

It is, therefore, an object of this invention to provide a simple circuit for protecting a power transistor against a short-circuited load that has a stable design-limit load current as a function of temperature.

It is a further object of this invention to provide such a circuit that does not limit the voltage swing across the load to substantially less than the DC power supply voltage that energizes the power transistor.

It is yet a further object of this invention to provide such a circuit that does not employ a load current sensing resistor connected in the emitter circuit of the power transistor, which resistors reduce the maximum achievable output voltage swing.

SUMMARY OF THE INVENTION

A circuit for protecting a bipolar power transistor from a short-circuited load has at least one protective bipolar transistor of the same polarity type as that of said power transistor. A voltage divider having two resistors and a diode is connected directly across the base-emitter junction of the power transistor with the diode in the polarity for conducting when the power transistor conducts. The one protective transistor has a base-emitter junction connected across a portion of the voltage divider which portion is composed of the diode and the another resistor. They are connected in the direction such that when the diode is forward biased, the one transistor tends to conduct also. A DC bias current means is provided for supplying bias current to the base of the power transistor. The collector of the one protective transistor is connected to the bias current source for reducing the DC bias current by an amount that is proportional or is at least directly related to the collector current of the one protective transistor.

The protective transistor may have an emitter resistor, in which case the above-noted portion of the voltage divider is connected across the series combination of the emitter resistor and the base-emitter junction of the protective transistor. That emitter resistor may advantageously be given a value which when multiplied by the current from the bias current source is about equal to the product of the design-limit load-current of the power transistor and the power transistor emitter resistance times the voltage-divider resistance ratio of the values of the another resistor over the sum of that of the one and another resistors. This relationship leads to a near zero temperature coefficient of the design-limit loadcurrent.

On the other hand, the protective transistor emitter resistor may have an essentially zero resistance in which case the above-noted temperature coefficient will be negative and still be several times smaller than that of the second-described prior art circuit. The advantage of that zero value for the emitter resistor is a greater circuit loop gain which leads to a more abrupt or sharper turn-on characteristic when the power transistor load is shorted.

BRIEF DESCRIPTION OF THE DRAWING

FIGS. 1, 2 and 3 show three short-circuit protection circuits of the prior art.

FIG. 4 shows a first preferred embodiment of the short-circuit protection circuit of this invention.

FIG. 5 shows a second preferred embodiment of the short-circuit protection circuit of this invention.

DESCRIPTION OF THE PREFERRED EMBODIMENTS

In a first preferred embodiment of this invention illustrated in FIG. 4, the power transistor 40 has no resistor in the emitter circuit. The voltage drop between the base and emitter of the power transistor 40 is impressed across the voltage divider having connected in series a first resistor 41, a diode 42 and a resistor 43. The base-emitter junction 44 is connected across the combination of diode 42 and the resistor 43. The transistor 44 has an emitter resistor 45 that, as will be seen, may have a zero resistance. Another transistor 46 is connected in standard Darlington fashion to the base of the power transistor 40. A bias source 48 supplies bias current $I_B$ to the power transistor 40 via transistor 46.

The one paragraph above, describing the operation of the prior art protective circuit in FIG. 2 applies to the circuit of FIG. 4 as well. However, the addition in FIG. 4 of the diode 42 has the surprising effect of greatly reducing changes in the design limit load current, $I_{LL}$, as a function of temperature. In fact, when a real resistor 45 is employed in the emitter of transistor 44, a zero temperature coefficient (TC) of $I_{LL}$ can be realized.

The brief analysis of the circuit of FIG. 4 given below will make these points evident. The transistors 44 and 46 and diode 42 will be assumed to be of the same size and formed together in an integrated circuit. This is a practical, though unnecessary assumption and it simplifies the analysis. The resistors 41, 43 and 45 have values indicated by $R_1$, $R_3$ and $R_5$, respectively. The emitter resistance of the power transistors (e.g. transistor 40) is designated herein by the symbol $r_{ep}$ and is defined as the ratio of the change of base-emitter voltage to a change in collector current (load current $I_L$) with a constant base current. This emitter resistance thus accounts for the classical diode voltage $V_{BE}$ that is a log function of emitter current, and also accounts for the linear ohmic resistances associated with the semiconductor emitter region and the emitter metal. These integral linear resistances are designated herein by the symbol $R_x$.

At very small collector (or emitter) currents, the classical diode "resistance" dominates, whereas at very large collector currents the linear ohmic resistances $R_x$ dominate. A power transistor in a power circuit of this invention is distinguished from a non-power transistor as one for which the design-limit load-current, $I_{LL}$, that actuates the short circuit protection portion of the circuit, is high enough that the power-transistor emitter resistance $r_{ep}$ is predominantly the linear ohmic ($R_x$) and is not substantially affected by the classical diode drop $V_{BE}$, i.e., the change in the classical diode drop is less than 10% of the total base-emitter voltage change due to an incremental change in load current.

The protected power transistor circuit of this invention is ideally suited for implementation in an integrated silicon circuit chip. The above-noted direct connection of the voltage divider across the base-emitter junction of the power transistor (e.g. 40) has two physical points of contact to the base and to the high-current carrying emitter conductor of the power transistor. Those points unambiguously circumscribe all the conductive sources of linear ohmic emitter resistance of the power transistor. That linear portion of emitter resistance is largely responsible for the increase of base-emitter voltage for a short-circuited power transistor which increase actuates the short circuit protection.

The base-emitter area of transistor 40 is A times larger than that of each of the other transistors (including diode 42). The collector current $I_L$ in transistor 40 will be assumed to equal the emitter current in this embodiment. The collector current 45 is assumed equal the emitter current. The characteristic reverse current of diode 42 is designated $I_o$ and thus the reverse current of the base-emitter junction of transistor 40 is $AI_o$.

The diode branch circuit current is designated $I_3$.
From inspection $$I_L R_x + V_T \ln \frac{I_L}{AI_o} = V_T \ln \frac{I_3}{I_o} + I_3(R_1 + R_3), \quad (1)$$

$$V_T \ln \frac{I_L}{AI_3} = I_3(R_1 + R_3) - I_L R_x \quad (2)$$

-continued and $$I_3 = \left( V_T \ln \frac{I_L}{AI_3} + I_L R_x \right) / R_1 + R_3. \quad (3)$$

Also from inspection $$V_T \ln \frac{I_5}{I_3} = I_3 R_3 - I_5 R_5 \quad (4)$$

and $$I_3 = \left( V_T \ln \frac{I_5}{I_3} + I_5 R_5 \right) / R_3 \quad (5)$$

where $I_5$ is collector current in transistor 44. Combining equations (3) and (5) gives $$V_T \ln \frac{I_5}{I_3} + I_5 R_5 = \frac{R_3}{R_1 + R_3} V_T \ln \frac{I_L}{AI_3} + \frac{R_3}{R_1 + R_3} I_L R_x \quad (6)$$

Now, considering a short-circuited load condition, this protective circuit will limit the load current $I_L$ to the design limit load current, $I_{LL}$. In this state, the current $I_5$ almost equals the bias current $I_B$ and the bias current left in the base of the power transistor is nearly zero. If the limit current $I_{LL}$ is to remain constant for all temperatures, this small base current must remain constant, as must currents $I_5$ and $I_3$. Thus, in equation (6), the first and third terms must be equal. Therefore, the second and fourth terms must be equal according to $$I_5 R_5 = \frac{R_3}{R_1 + R_3} I_L R_x \quad (7)$$

Since under short circuit conditions $I_5 \cong I_B$, then $$I_B R_5 = \frac{R_3}{R_1 + R_3} I_{LL} R_x \quad (8)$$

so that only the resistor values are not known. Values $R_1$ and $R_3$ in the voltage divider branch are chosen to establish the desired $I_{LL}$ and $R_5$ is then determined by equation (8) to obtain a zero TC of $I_{LL}$.

As was noted, it is desirable that a short circuit protection circuit have a sharp turn-on characteristic. A higher loop gain will lead to a sharper turn-on characteristic and may be accomplished in the circuit of FIG. 4 by reducing the value $R_5$ of resistor 45 below that at which a zero TC of $I_{LL}$ was obtained. A measure of the loop gain is given by $\Delta I_5/\Delta I_L$ which may be derived as follows:

$$\Delta I_5 = \frac{\Delta V_{B44}}{r_{e5} + R_5} \quad (9)$$

where $V_{B44}$ and $r_{e5}$ refer respectively to the base voltage and emitter resistance of transistor 44.

$$\Delta V_{B44} = \Delta V_{BP} \frac{R_3 + r_{e3}}{R_1 + R_3 + r_{e3}} \quad (10)$$

where $V_{BP}$ is the base voltage of the power transistor 40 and $r_{e3}$ refers to the "emitter resistance" of the diode 42, and $$\Delta V_{BP} = \Delta I_L r_{ep}. \quad (11)$$

From equations (8), (9) and (10)

$$\frac{\Delta I_5}{\Delta I_L} \approx \frac{(r_{ep}) \frac{R_3 - r_{e3}}{R_1 + R_3 + r_{e3}}}{R_5 + r_{e5}}$$

From this indication of loop gain, it can be seen that loop gain is increased by letting $R_5$ go to zero.

In the second preferred embodiment of this invention illustrated in FIG. 5, the power transistor 50 also has no emitter resistor. The base and emitter are connected directly across the voltage divider made up of resistor 51, diode 52 and resistor 53. The protective transistor 54 has no emitter resistor either, and the base and emitter of transistor 54 are connected directly across the voltage divider portion composed of diode 52 and resistor 53.

A bias current source 58 provides a constant current $I_B$. During normal non-shorted-load conditions, a bias current applied to the base of transistor 55 renders this transistor conductive so that the second protective transistor 56 is effectively coupled in standard Darlington fashion to the base of the power transistor 50. In this case, the bias current $I_B$ establishes the bias level of the Darlington pair for normal operation. Also, a signal applied to the base of transistor 55 is amplified through power transistor 50. This circuit has been built as an integrated silicon circuit including the load terminals or pads 61 and 62 to which an external load 63 may be attached.

As in the circuit of FIG. 4, the protective transistor (54) in FIG. 5 is off during normal operation, i.e. the load is not short circuited. A variable current source 64 supplies a bias current to the base of the PNP transistor 55. The output voltage at terminal 61 is kept at the level of the input voltage to the base of transistor 55 by base-emitter voltages in transistors 55 and 56 and diodes 65 and 66. Variations in the current from source 64 represent the input signal.

In this circuit the power transistor 50 has a base-emitter area that is larger than that of the diode 52 (and transistor 54) by a factor of 100. The values of resistors 51 and 53 are respectively 1900 and 280 ohms and $V_{CC}$ is +6 volts. The linear ohmic emitter resistance $R_x$ of the power transistor 50 is almost 90 milliohms and the design-limit load current $I_{LL}$ is 2 amperes. This current $I_{LL}$ was found to vary 5% over a temperature excursion of 100° C.

The short circuit protection circuit of this invention may advantageously by employed in voltage regulator circuits and in class A single ended, push-pull and bridge power circuits. For example, the basic short circuit protection circuit of FIG. 4 may be used both in the source and sink circuit portions of a push-pull class A-B audio power amplifier wherein the load is in the emitter of the source power transistor and in the collector of the sink power transistor, Furthermore, although the protected circuitry of FIGS. 4 and 5 are for NPN power transistors, all the semiconductor components there may have the opposite polarity so as to provide a PNP power transistor with short circuit protection.

What is claimed is:

1. A circuit comprising:
   (a) a bipolar output transistor of one polarity type;

(b) a terminal connected to the collector of said output transistor to which an electrical load may be attached;
(c) a first protective bipolar transistor of said one polarity type;
(d) a DC-bias current source connected to the base of said first transistor for biasing-on said first transistor;
(e) a voltage divider comprised of a diode and one and another resistors connected in series, said voltage divider being connected directly across the base-emitter junction of said output transistor, said diode being connected in the polarity such that a forward current in said diode tends to forward bias said output transistor; and
(f) a second protective transistor of said one polarity type having a base-emitter junction connected across the portion of said voltage divider which is composed of said diode and said another resistor in the direction whereby a forward current through said diode would tend to forward bias said base-emitter junction of said second transistor, and having a collector connected to the base of said first protective transistor; and
(g) a third protective transistor of the opposite polarity type having an emitter connected to the emitter of said first protective transistor and a collector connected to said base of said output transistor so that a signal to be amplified by said output transistor may be applied to the base of said third transistor.

2. The circuit of claim 1 additionally comprising a circuit branch having two diodes connected in series and in the same polarity, said branch being connected between said base of said first transistor and said collector of said output transistor in a direction whereby a forward-diodes current through said circuit branch diminishes the amount of said bias current that flows in said base of said first protective transistor.

* * * * *